(12) United States Patent
Ok et al.

(10) Patent No.: US 8,163,397 B2
(45) Date of Patent: *Apr. 24, 2012

(54) METHOD AND APPARATUS FOR PROVIDING HERMETIC ELECTRICAL FEEDTHROUGH

(75) Inventors: Jerry Ok, Canyon Country, CA (US);
Robert J. Greenberg, Los Angeles, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/165,388

(22) Filed: Jun. 21, 2011

(65) Prior Publication Data

US 2011/0253432 A1    Oct. 20, 2011

Related U.S. Application Data

(62) Division of application No. 11/493,469, filed on Jul. 25, 2006, now Pat. No. 7,989,080, which is a division of application No. 09/823,464, filed on Mar. 30, 2001, now Pat. No. 7,480,988.

(51) Int. Cl.
*H05K 1/03* (2006.01)
(52) U.S. Cl. ............. 428/472.2; 428/210; 174/257; 174/258; 174/262; 174/264; 439/55
(58) Field of Classification Search ........... 428/210, 428/472.2; 174/257, 258, 262, 264; 439/55
See application file for complete search history.

(56) References Cited

U.S. PATENT DOCUMENTS

| | | |
|---|---|---|
| 3,517,437 A | 6/1970 | Szobonya |
| 3,999,004 A | 12/1976 | Chirino et al. |
| 5,046,242 A | 9/1991 | Kuzma |
| 5,095,246 A | 3/1992 | Feuersanger et al. |
| 5,109,844 A | 5/1992 | de Juan, Jr. et al. |
| 5,241,216 A | 8/1993 | Webster |
| 5,272,283 A | 12/1993 | Kuzma |
| 5,368,220 A | 11/1994 | Mizuhara et al. |
| 5,515,604 A * | 5/1996 | Horine et al. ............. 29/830 |
| 5,640,764 A | 6/1997 | Strojnik |
| 5,738,270 A | 4/1998 | Malmgren |
| 5,817,984 A | 10/1998 | Taylor et al. |
| 5,935,155 A | 8/1999 | Humayun et al. |
| 5,997,999 A * | 12/1999 | Horiuchi et al. ........... 428/210 |
| 6,093,476 A * | 7/2000 | Horiuchi et al. ........... 428/209 |
| 6,174,175 B1 * | 1/2001 | Behfar et al. ............... 439/91 |
| 6,329,631 B1 * | 12/2001 | Yueh ..................... 219/121.65 |
| 6,400,989 B1 | 6/2002 | Eckmiller |
| 6,458,157 B1 | 10/2002 | Suaning |
| 7,709,961 B2 * | 5/2010 | Greenberg et al. ......... 257/769 |
| 7,989,080 B2 * | 8/2011 | Greenberg et al. ....... 428/472.2 |

* cited by examiner

*Primary Examiner* — Cathy Lam

(74) *Attorney, Agent, or Firm* — Scott B. Dunbar

(57) ABSTRACT

A method and apparatus suitable for forming hermetic electrical feedthroughs in a ceramic sheet having a thickness of .ltoreq.40 mils. More particularly, the method yields an apparatus including a hermetic electrical feedthrough which is both biocompatible and electrochemically stable and suitable for implantation in a patient's body. The method involves: (a) providing an unfired, ceramic sheet having a thickness of .ltoreq.40 mils and preferably comprising .ltoreq.99% aluminum oxide; (b) forming multiple blind holes in said sheet; (c) inserting solid wires, preferably of platinum, in said holes; (d) firing the assembly of sheet and wires to a temperature sufficient to sinter the sheet material but insufficient to melt the wires; and (e) removing sufficient material from the sheet lower surface so that the lower ends of said wires are flush with the finished sheet lower surface.

15 Claims, 4 Drawing Sheets

METHOD AND APPARATUS FOR PROVIDING HERMETIC ELECTRICAL FEEDTHROUGH

CROSS-REFERENCE TO RELATED APPLICATIONS

This application is a divisional application of U.S. patent application Ser. No. 11/493,469, filed Jul. 25, 2006, for Method and Apparatus for Providing Hermetic Electrical Feedthrough, published as 2006/0283624 now U.S. Pat. No. 7,989,080, which is a division of U.S. patent application Ser. No. 09/823,464, filed Mar. 30, 2001 for Method and Apparatus for Providing Hermetic Electrical Feedthrough, now U.S. Pat. No. 7,480,988, the disclosures of which is incorporated herein by reference.

FIELD OF THE INVENTION

This invention relates generally to a method and apparatus for providing electrical feedthroughs and more particularly to a method and apparatus suitable for forming hermetic electrical feedthroughs through a thin ceramic sheet. "Thin ceramic sheet" as used herein refers to a sheet having a finished thickness dimension of .ltoreq.40 mils, i.e., 1 mm. Apparatus in accordance with the invention is particularly suited for use in corrosive environments such as in medical devices implanted in a patient's body.

BACKGROUND OF THE INVENTION

Various approaches are described in the literature for fabricating hermetically sealed electrical circuit housings suitable for extended operation in corrosive environments, e.g., in medical devices implanted in a patient's body. For such applications, housing must be formed of biocompatible and electrochemically stable materials and typically must include a wall containing multiple hermetic electrical feedthroughs. A hermetic electrical feedthrough is comprised of electrically conductive material which extends through and is hermetically sealed in the wall material.

One known approach for forming feedthroughs uses platinum thickfilm vias through 92% or 96% aluminum oxide ceramic with significant glass content. This glass content is susceptible to hydroxide etching that may occur as an electrochemical reaction to an aqueous chloride environment such as is found in the human body. This will, over extended time, compromise the hermeticity and structural stability of the feedthrough. Typically, 92% aluminum oxide ceramic is used in conjunction with a platinum/glass or platinum/aluminum oxide thickfilm paste. These material systems are generally formulated to optimize coefficient of thermal expansion mismatches and achieve a hermetic feedthrough. However, use of metal/insulator frit significantly reduces the conductive volume of the feedthrough limiting the current carrying capacity of the feedthrough.

An alternative approach uses an assembled pin feedthrough consisting of a conductive pin that is bonded chemically at its perimeter through brazing or the use of oxides, and/or welded, and/or mechanically bonded through compression to a ceramic body. Typically, gold is used as a braze material that wets the feedthrough pin and the ceramic body resulting in a hermetic seal. Wetting to the ceramic body requires a deposited layer of metal such as titanium. This layer acts additionally as a diffusion barrier for the gold.

Other alternative feedthrough approaches use a metal tube cofired with a green ceramic sheet. The hermeticity of the metal/ceramic interface is achieved by a compression seal formed by material shrinkage when the assembly is fired and then allowed to cool. The use of a tube inherently limits the smallest possible feedthrough to the smallest available tubing. Acceptable results have been reported only when using tubes having a diameter>40 mils in ceramic substrates at least 70 mils thick.

SUMMARY OF THE INVENTION

The present invention is directed to a method and apparatus suitable for forming hermetic electrical feedthroughs in a ceramic sheet (or substrate) having a thickness of .ltoreq.40 mils. More particularly, the invention is directed to a method and apparatus for forming a structure including a hermetic electrical feedthrough which is both biocompatible and electrochemically stable and suitable for implantation in a patient's body.

A preferred method in accordance with the invention involves:

(a) providing a green, or unfired, ceramic sheet having a thickness of .ltoreq.40 mils and preferably comprising .ltoreq.99% aluminum oxide;

(b) forming multiple blind holes in said sheet extending from a sheet upper surface toward a sheet lower surface;

(c) inserting solid wires (or pins), preferably of platinum, in said holes, the wires and holes preferably having a diameter of .ltoreq.20 mils;

(d) firing the assembly of sheet and wires to a temperature (e.g., 1600.degree. C.) sufficient to sinter the sheet material but insufficient to melt the wires, to cause ceramic shrinkage to form hermetic compression seals around the wires; (e) removing, e.g., as by grinding or lapping, sufficient material from the sheet lower surface so that the lower ends of said wires are flush with the finished sheet lower surface.

Preferred embodiments of the invention employ an unfired ceramic sheet of .ltoreq.99% aluminum oxide but alternative embodiments can use other ceramic materials, e.g., zirconia. The wires preferably comprise high purity platinum. However, because the firing temperature of the ceramic can be tailored within certain limits, various other metals, e.g., titanium, gold, palladium, tantalum and niobium, can be used for the feedthrough material, i.e., wires.

In one preferred method of practicing the invention, a 40 mil thick sheet of .gtoreq.99% aluminum oxide is drilled to form one or more blind holes, each having a diameter slightly greater than 4 mils and a depth of about 20 mils. A 4 mil diameter platinum wire cut to a length greater than 20 mils is then inserted into each hole. The ceramic sheet/wire assembly is then fired to a temperature sufficient to sinter the ceramic but insufficient to melt the platinum. An exemplary firing schedule includes ramping up to 600.degree. C. at a rate of 1.degree. C./minute, then ramping up to 1600.degree. C. at a rate of 5.degree. C./minute, followed by a one hour dwell and then a cool-to-room-temperature interval. The heating and subsequent cooling of the ceramic material causes the holes to shrink and the ceramic to form a compression seal against the wires. The ceramic sheet is then lapped from the lower sheet surface until the wires are visible. In a preferred embodiment, both surfaces of the ceramic sheet are then polished so that the wires terminate flush with both sheet surfaces leaving the surfaces ready for subsequent processing, e.g., lithography, chip/component surface mounting etc. The sheet/wire assembly is then preferably finished to a thickness .ltoreq.20 mils, e.g., less than 12 mils.

Embodiments constructed in accordance with the present invention are able to achieve very high feedthrough density.

For example only, in applications where miniaturization is important, the feedthrough pitch, i.e., center-to-center distance between adjacent feedthroughs is .ltoreq.40 mils, and preferably .ltoreq.20 mils.

BRIEF DESCRIPTION OF THE DRAWINGS

FIGS. 4A-4E respectively depict the fabrication stages of a feedthrough assembly in accordance with the process flow illustrated in FIG. 3, wherein FIG. 4A depicts a plane view of a unfired ceramic sheet;

FIG. 4B1 shows patterns of blind holes in the sheet and FIG. 4B2 is a sectional view taken along plane 4B2-4B2;

FIG. 4C1 shows wires inserted into the blind holes and FIG. 4C2 is a sectional view taken along plane 4C2-4C2;

FIG. 4D1 shows the sheet and wires after being fired and FIG. 4D2 is a sectional view taken along plane 4D2-4D2 depicting the removal of material from the lower sheet surface to align the wire lower faces with the sheet lower surface;

FIG. 4E shows the sheet after dicing to form multiple feedthrough assemblies.

DETAILED DESCRIPTION

Figure 1:
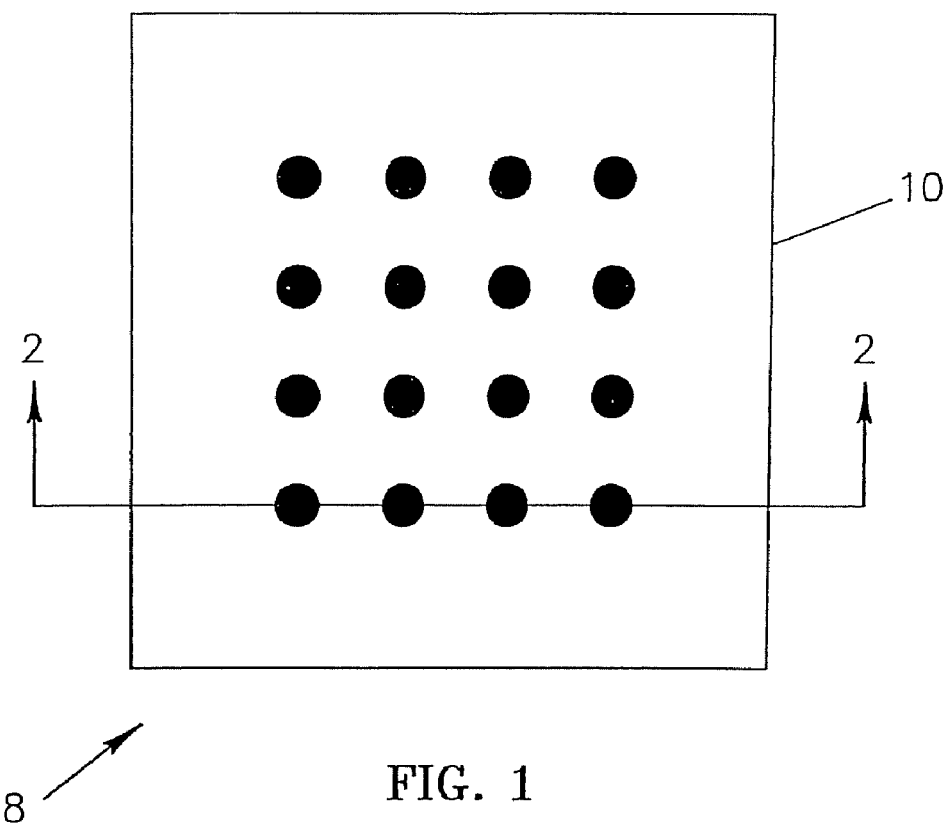
FIG. 1 is a top view of a finished feedthrough assembly in accordance with the present invention comprised of a thin ceramic sheet having electrically conductive wires extending therethrough.
Figure 2:
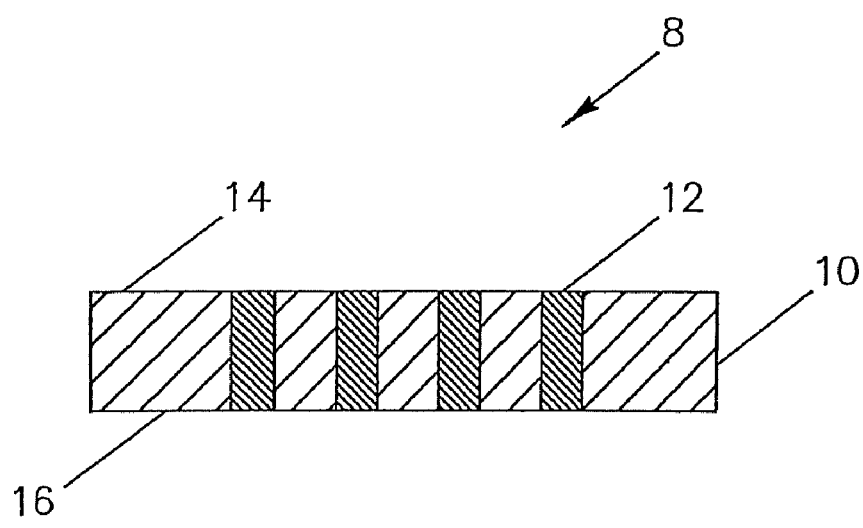
FIG. 2 is a sectional view taken substantially along the plane 2-2 of FIG. 1 showing the wire ends flush with the surfaces of the thin ceramic sheet.

Attention is initially directed to FIGS. 1 and 2 which depict a preferred feedthrough assembly 8 in accordance with the present invention comprising a thin sheet 10 of ceramic material having multiple electrical feedthroughs 12 extending therethrough terminating flush with the upper and lower surfaces 14, 16 of sheet 10. The sheet 10 typically comprises a wall portion of a housing (not shown) for accommodating electronic circuitry. The feedthroughs 12 function to electrically connect devices external to the housing, e.g., adjacent to surface 14, to electronic circuitry contained within the housing, e.g., adjacent to surface 16.

Electrical feedthroughs in accordance with the invention are intended to function in corrosive environments, e.g., in medical devices intended for implantation in a patient's body. In such applications, it is generally critical that the device housing be hermetically sealed which, of course, requires that all feedthroughs in the housing wall also be hermetic. In such applications, it is also generally desirable that the weight and size of the housing be minimized and that all exposed areas of the housing be biocompatible and electrochemically stable. Biocompatibility assures that the implanted device has no deleterious effect on body tissue. Electrochemical stability assures that the corrosive environment of the body has no deleterious effect on the device. Ceramic and platinum materials are often used in implantable medical devices because they typically exhibit both biocompatibility and electrochemical stability.

The present invention is directed to providing electrical feedthroughs compatible with thin ceramic sheets (or substrates) having a finished thickness of .ltoreq.40 mils, which feedthroughs are hermetic, biocompatible, and electrochemically stable. In accordance with a preferred embodiment of the invention, the ceramic sheet 10 is formed of 99% aluminum oxide and the feedthrough wires 12 are solid and formed of high purity platinum having a diameter .ltoreq.20 mils.

Attention is now directed to FIGS. 3 and 4A-4E which depict the preferred processed steps for fabricating the finished feedthrough assembly 8 illustrated in FIGS. 1 and 2.

Initially, an unfired ceramic sheet 20 (FIG. 4A), preferably of .gtoreq.99% aluminum oxide is selected. The unfired ceramic sheet is preferably formed by rolling unfired ceramic material to impart shear forces to agglomerates in the moist ceramic slurry. This rolling process breaks down these agglomerates and produces a sheet of dense uniformly distributed fine aluminum oxide particulate.

Figure 3:
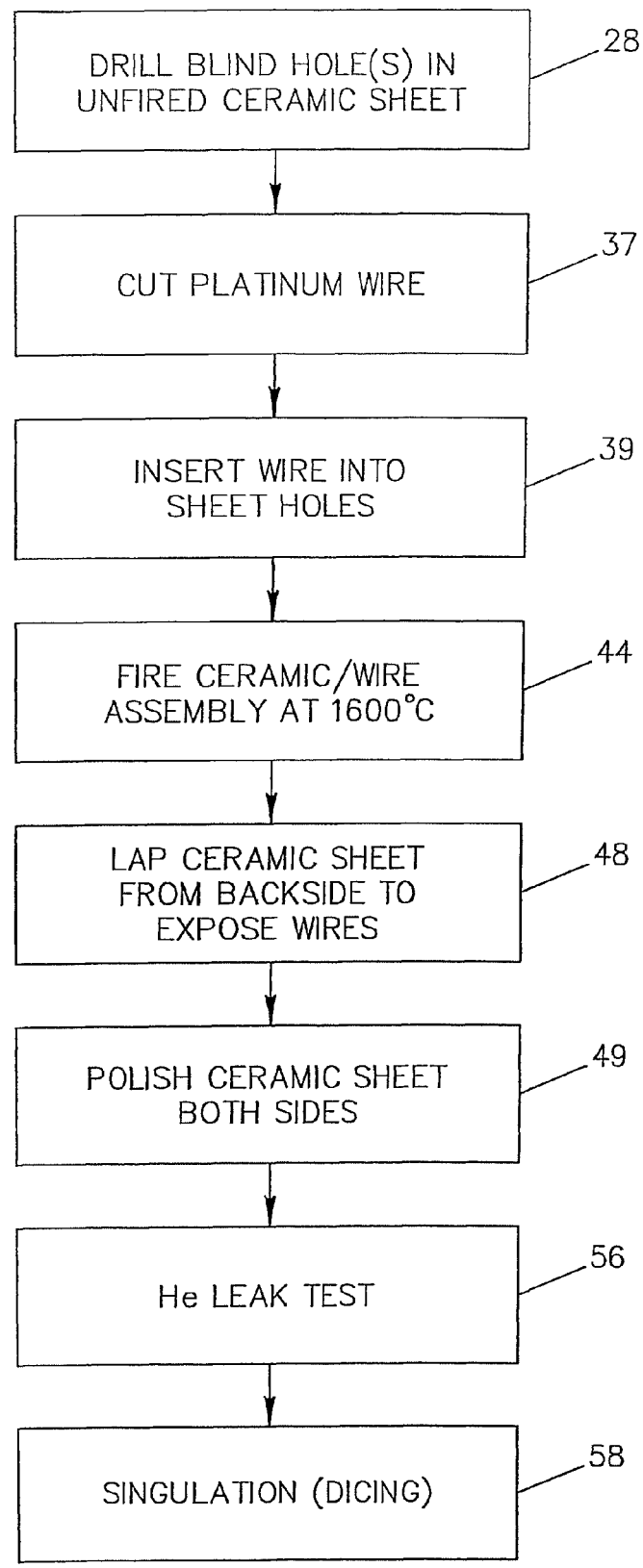
FIG. 3 is a flow diagram illustrating a preferred series of process steps for fabricating a feedthrough assembly in accordance with the present invention.
Figure 4A:
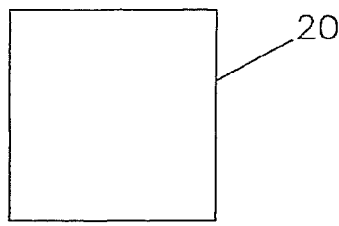
Figure 4A:
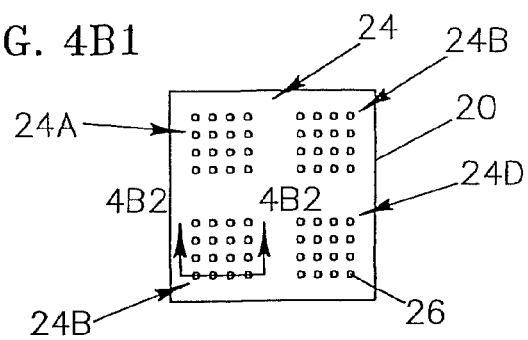
Figure 4A:
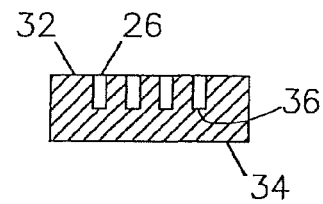
Figure 4A:
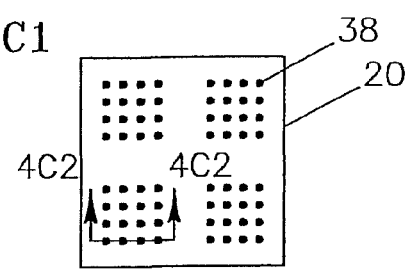
Figure 4A:
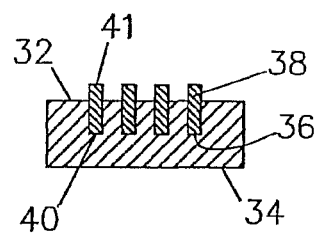
Figure 4A:
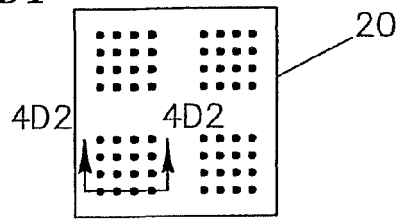
Figure 4A:
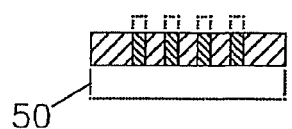
Figure 4E:
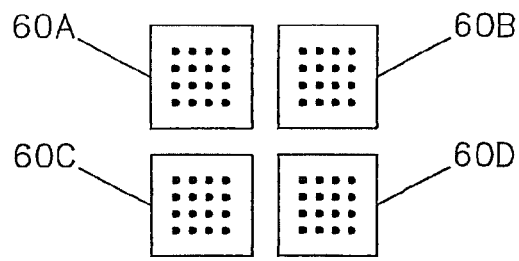

A pattern 24 of blind holes 26 is drilled into the sheet 20 as represented by block 28 in FIG. 3. Note that the pattern 24 is replicated at 24A, 24B, 24C, 24D. In an exemplary preferred embodiment, it will be assumed that the unfired sheet 20 has a thickness of 40 mils and that each hole 26 has a diameter of 4.3 mils (i.e., 0.0043") and is drilled from a sheet upper surface 32 toward a sheet lower surface 34, terminating at a hole floor 36 FIG. 4B. In typical applications, the hole pattern is densely being comprised of holes spaced by .ltoreq.40 mils from adjacent holes and in some applications by .ltoreq.20 mils.

Step 37 of FIG. 3 calls for cutting lengths of solid homogenous high purity platinum wire to form multiple wire pieces 38, each having a length .gtoreq.20 mils. The wires 38 are then inserted (step 39, FIG. 3) into the blind holes 26 as depicted in FIG. 4C2 with the wire lower ends 40 resting on the hole floors 36 and the wire upper ends 41 extending above the sheet upper surface 32. Since the holes 26 preferably have a diameter of 0.0043" and the wires 38 have a diameter of 0.0040", the wires can be readily, but snugly, received in the holes.

Step 44 of FIG. 3 calls for the ceramic/wire assembly to be fired. The maximum firing temperature should be sufficient to sinter the material of the ceramic sheet 20 but insufficient to melt the material of the wires 38. Assuming a ceramic sheet of .gtoreq.99% aluminum oxide and high purity platinum wires, a firing temperature of 1600.degree. C. satisfies this requirement. An exemplary preferred firing schedule includes ramping the assembly up to 600.degree. C. at a rate of 1.degree. C./minute, then ramping up to 1600.degree. C. at a rate at 5.degree. C./minute, followed by a one hour dwell and then a cool-to-room-temperature interval.

During the firing and subsequent cooling, the ceramic expands shrinking the holes around the wires 38 to form a compression seal. The shrinkage is believed to occur, at least in part, as a consequence of polymer binder burnout. The fine aluminum oxide suspension permits uniform and continuous sealing around the surface of the wire. Additionally, at the maximum firing temperature, e.g., 1600.degree. C., the solid platinum wires being squeezed by the ceramic exhibit sufficient plasticity to enable the platinum to flow and fill any crevices. This action produces a hermetic metal/ceramic interface.

Step 48 of FIG. 3 calls for lapping or grinding the lower surface of the fired ceramic sheet to remove material 50, depicted in FIG. 4D2, in order to expose the lower faces of the wires 38. The lower sheet surface is preferably also polished so that the wire lower faces are flush with the finished lower sheet surface. The sheet upper surface is also preferably lapped and polished to form upper wire faces which are flush with the upper sheet surface (FIG. 2). The thickness of the finished sheet, and wire lengths, in a preferred embodiment is typically .ltoreq.12 mils.

After lapping, the feedthrough assembly comprised of the finished ceramic sheet and feedthrough wires, is subjected to a hermeticity test, e.g., frequently a helium leak test as represented by block 56 in FIG. 3. Thereafter, the ceramic sheet 20 can be subjected to a singulation or dicing step 58 to provide multiple feedthrough assemblies 60A, 60B, 60C, 60D.

Figure 5:
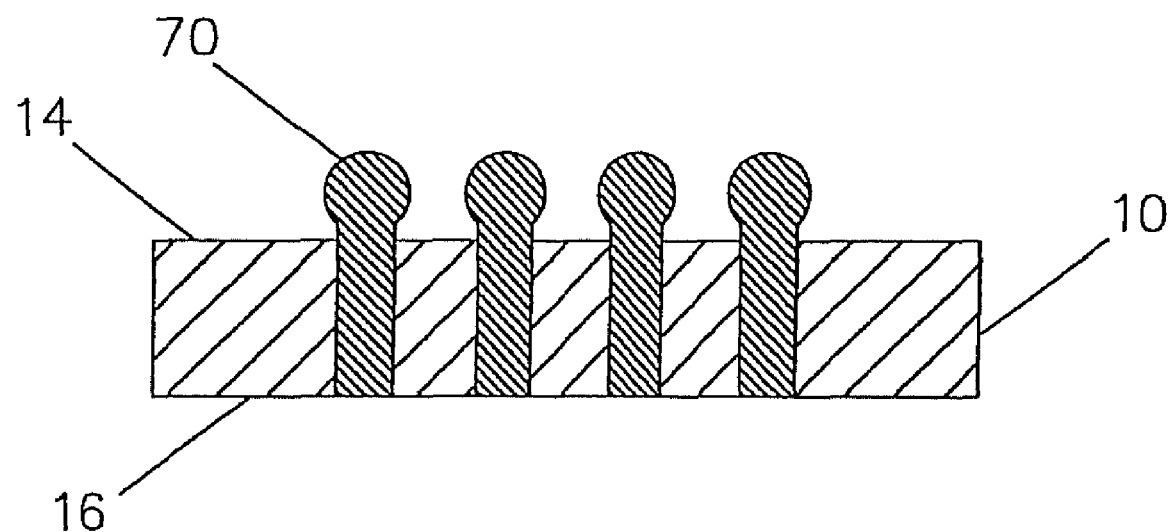
FIG. 5 comprises a sectional view similar to FIG. 2 but depicting an alternative embodiment of the invention.

Attention is now directed to FIG. 5 which shows an alternative embodiment of the invention in which the upper ends of the wires protrude beyond the ceramic sheet upper surface. More particularly, FIG. 5 is similar to FIG. 2 but shows the feedthroughs 12A protruding above sheet upper surface 14A and terminating at terminal 70. Terminal 70 can be essentially spherically shaped, as shown, or can be otherwise configured to facilitate interconnection with mating terminals (not shown), as by welding.

From the foregoing, it should now be appreciated that electrical feedthrough assemblies and fabrication methods therefore have been described suitable for use in medical devices intended for implantation in a patient's body. Although a specific structure and fabrication method has been described, it is recognized that variations and modifications will occur to those skilled in the art coming within the spirit and scope of the invention as defined by the appended claims.

The invention claimed is:

1. A hermetic structure comprising: a sheet of ceramic material having upper and lower parallel surfaces spaced by less than 40 mils; at least one feedthrough filled with electrically conductive material formed of substantially pure platinum, extending through said sheet, in contact with said sheet; and wherein said sheet of ceramic material forms a hermetic seal around said electrically conductive material.

2. The hermetic structure according to claim 1, wherein said upper and lower surfaces are spaced by less than 20 mils.

3. The hermetic structure according to claim 1, including a plurality of feedthroughs filled with electrically conductive material extending through said sheet; and wherein at least some of said feedthroughs are spaced by less than 20 mils.

4. The hermetic structure according to claim 1, wherein said electrically conductive material includes an end terminating flush with one of said sheet surfaces.

5. The hermetic structure according to claim 1, wherein one end of said electrically conductive material protrudes beyond one of said sheet surfaces.

6. The hermetic structure according to claim 1, wherein said feedthrough has a diameter of less than 10 mils.

7. The hermetic structure according to claim 1, wherein said ceramic material is from the group comprised of aluminum oxide and zirconia.

8. The hermetic structure according to claim 1, wherein said ceramic material comprises at least 99% aluminum oxide.

9. A hermetic structure comprising: a sheet of ceramic material having upper and lower parallel surfaces spaced by less than about 40 mils; at least one feedthrough filled with electrically conductive material formed of substantially pure platinum, extending through said sheet, in contact with said sheet; said sheet of ceramic material forming a hermetic seal around said electrically conductive material; and wherein said feedthrough has a diameter of less than 10 mils.

10. The hermetic structure according to claim 9, wherein said upper and lower surfaces are spaced by less than 20 mils.

11. The hermetic structure according to claim 9, including a plurality of feedthroughs filled with electrically conductive material extending through said sheet; and wherein at least some of said electrically conductive materials are spaced by less than 20 mils.

12. The hermetic structure according to claim 9, wherein said electrically conductive material includes an end terminating flush with one of said sheet surfaces.

13. The hermetic structure according to claim 9, wherein one end of said electrically conductive material protrudes beyond one of said sheet surfaces.

14. The hermetic structure according to claim 9, wherein said ceramic material comprises aluminum oxide, zirconia, or mixtures thereof.

15. The hermetic structure according to claim 9, wherein said ceramic material comprises at least 99% aluminum oxide.

* * * * *